United States Patent
Liu

(10) Patent No.: US 8,392,775 B2
(45) Date of Patent: Mar. 5, 2013

(54) SHIFT REGISTER CIRCUIT

(75) Inventor: Chun-Yen Liu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 616 days.

(21) Appl. No.: 12/640,012

(22) Filed: Dec. 17, 2009

(65) Prior Publication Data

US 2011/0041020 A1 Feb. 17, 2011

(30) Foreign Application Priority Data

Aug. 12, 2009 (TW) .............................. 98127091 A

(51) Int. Cl.
  *G01R 31/3177* (2006.01)
  *G01R 31/40* (2006.01)
(52) U.S. Cl. ...................................... 714/731; 714/729
(58) Field of Classification Search ..................... None
  See application file for complete search history.

(56) References Cited

U.S. PATENT DOCUMENTS

| | | | | |
|---|---|---|---|---|
| 5,111,062 A | * | 5/1992 | Hunter et al. | 327/292 |
| 7,333,079 B2 | * | 2/2008 | Shibusawa et al. | 345/76 |
| 2005/0073516 A1 | * | 4/2005 | Kang | 345/204 |
| 2007/0170967 A1 | * | 7/2007 | Bae et al. | 327/233 |
| 2008/0024418 A1 | | 1/2008 | Kim | |
| 2008/0246697 A1 | * | 10/2008 | Kim | 345/76 |

* cited by examiner

*Primary Examiner* — Ajay Bhatia
*Assistant Examiner* — Dipakkumar Gandhi
(74) *Attorney, Agent, or Firm* — Winston Hsu; Scott Margo

(57) ABSTRACT

A shift register circuit for providing plural scan signals and plural emission signals includes a plurality of shift register stages. Each shift register stage includes a scan signal generation module and an emission signal generation module. The scan signal generation module is utilized for generating a first scan signal and a second scan signal according to a first clock and a second clock having a phase opposite to the first clock. The first and second scan signals have pulses opposite to each other. The pulse width of the first scan signal is substantially twice that of the first clock. The emission signal generation module is utilized for generating an emission signal according to a third clock and a fourth clock having a phase opposite to the third clock. The pulse width of the emission signal is substantially identical to that of the third clock.

19 Claims, 11 Drawing Sheets

SHIFT REGISTER CIRCUIT

BACKGROUND OF THE INVENTION

1. Field of the Invention

The present invention relates to a shift register circuit, and more particularly, to a shift register circuit for providing plural scan signals and plural emission signals.

2. Description of the Prior Art

Along with the advantages of thin appearance, low power consumption, and low radiation, flat panel displays have been widely applied in various electronic products such as computer monitors, mobile phones, personal digital assistants (PDAs), or flat panel televisions. In general, the flat panel display comprises plural pixel units, a shift register circuit, and a source driver. The source driver is utilized for providing plural data signals to be written into the pixel units. The shift register circuit is employed to generate plural scan signals furnished to the pixel units for providing a control of writing the data signals into the pixel units.

FIG. 1 is a schematic diagram showing a prior-art shift register circuit 100. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is utilized for generating one corresponding scan signal furnished to one corresponding scan line according to a first clock CK1 and a second clock CK2 having a phase opposite to the first clock CK1. For instance, the Nth shift register stage 112 includes a plurality of P-type thin film transistors for generating a scan signal SSn furnished to a scan line LSn based on the first clock CK1, the second clock CK2, a low reference voltage Vgl and a high reference voltage Vgh.

FIG. 2 is a schematic diagram showing related signal waveforms regarding the operation of the shift register circuit 100 shown in FIG. 1, having time along the abscissa. The signal waveforms in FIG. 2, from top to bottom, are the first clock CK1, the second clock CK2, the scan signal SSn−1, the scan signal SSn and the scan signal SSn+1. As shown in FIG. 2, the pulse widths of the scan signals SSn−1~SSn+1 generated by the shift register circuit 100 are substantially identical to the pulse width of the first clock CK1. With the aim of enhancing image quality of flat panel displays, extra threshold compensation mechanism is commonly added to each pixel unit for providing an accurate control of pixel brightness. However, in order to properly operate the pixel unit with threshold compensation mechanism for enhancing image quality, emission signals are further required to assist the scan signals in performing related driving operations and, moreover, the pulse widths of the emission signals or the scan signals are required to be greater than the pulse width of the first clock CK1, e.g. twice the pulse width of the first clock CK1. In view of that, the prior-art shift register circuit 100 is not suitable for use in driving the pixel units with threshold compensation mechanism.

SUMMARY OF THE INVENTION

In accordance with one embodiment of the present invention, a shift register circuit for providing plural scan signals and plural emission signals is disclosed. The shift register circuit comprises a plurality of shift register stages. Each shift register stage comprises a scan signal generation module and an emission signal generation module. The scan signal generation module, electrically connected to a first scan line and a second scan line, is utilized for generating a first scan signal and a second scan signal which have pulses opposite to each other according to a first clock and a second clock having a phase opposite to the first clock. The first and second scan signals are furnished to the first and second scan lines respectively. And the pulse width of the first scan signal is substantially twice the pulse width of the first clock. The emission signal generation module, electrically connected to a transmission line, is utilized for generating an emission signal according to a third clock and a fourth clock having a phase opposite to the third clock. The emission signal is furnished to the transmission line. And the pulse width of the emission signal is substantially identical to the pulse width of the third clock.

In accordance with another embodiment of the present invention, a shift register circuit for providing plural scan signals and plural emission signals is disclosed. The shift register circuit comprises a plurality of shift register stages. An Nth shift register stage of the shift register stages comprises a first pull-down unit, a first pull-up unit, an input unit, a control unit, a second pull-up unit, and an emission signal generation module. The first pull-down unit is utilized for pulling down an Nth scan signal of the scan signals according to a driving control voltage and a first clock. The first pull-up unit is utilized for pulling up the Nth scan signal according to an (N+1)th scan signal. The input unit, electrically connected to the first pull-down unit, is utilized for inputting an (N−1)th scan signal to become the driving control voltage according to a second clock. The control unit is electrically connected to the input unit and functions to generate a control signal according to the driving control voltage. The second pull-up unit is electrically connected to the control unit and functions to pull up the driving control voltage and the Nth scan signal according to the control signal. The emission signal generation module, electrically connected to the input unit, is utilized for generating an Nth emission signal of the emission signals according to the driving control voltage.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
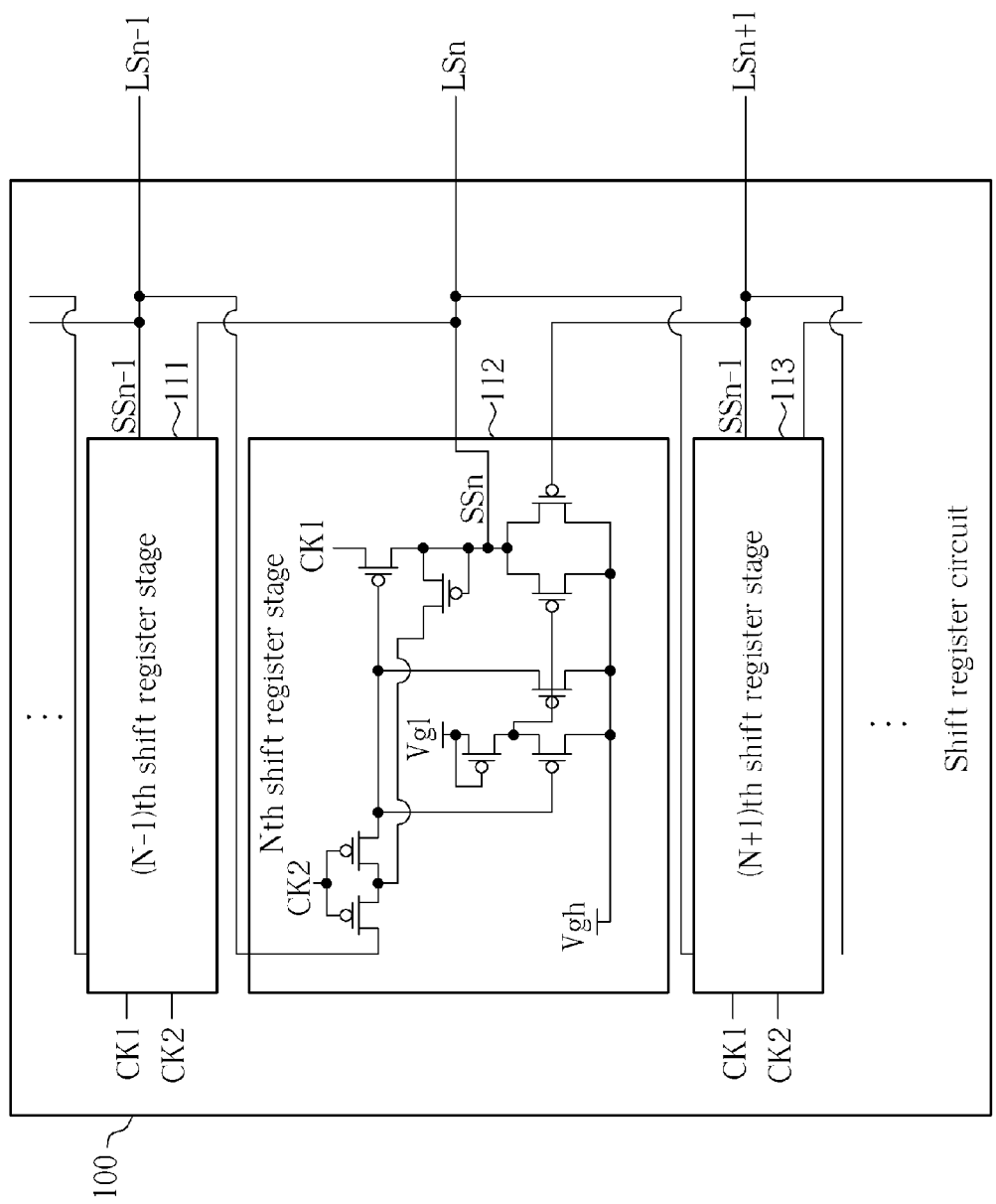
FIG. 1 is a schematic diagram showing a prior-art shift register circuit.
Figure 2:
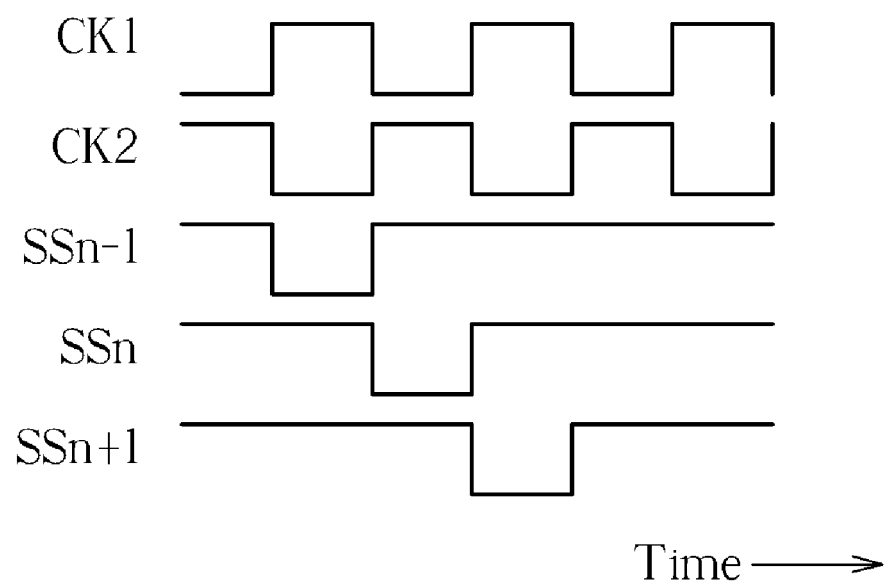
FIG. 2 is a schematic diagram showing related signal waveforms regarding the operation of the shift register circuit shown in FIG. 1, having time along the abscissa.
Figure 3:
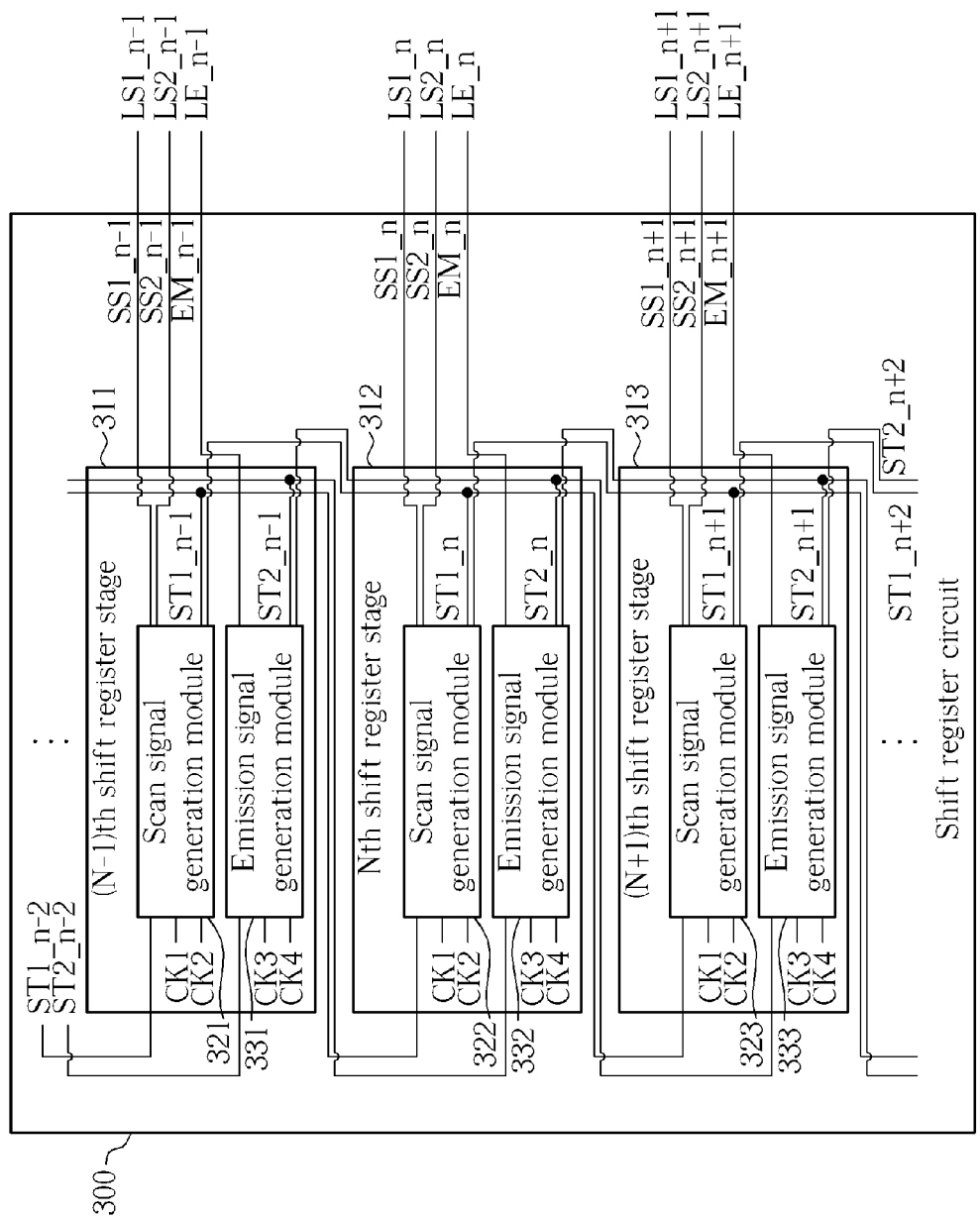
FIG. 3 is a structural diagram schematically showing a shift register circuit in accordance with a first embodiment of the present invention.

FIG. 3 is a structural diagram schematically showing a shift register circuit 300 in accordance with a first embodiment of the present invention. As shown in FIG. 3, the shift register circuit 300 comprises a plurality of shift register stages and, for ease of explanation, illustrates an (N−1)th shift register stage 311, an Nth shift register stage 312 and an (N+1)th shift register stage 313. The number N is a positive integer. The (N−1)th shift register stage 311 includes a scan signal generation module 321 and an emission signal generation module 331. The scan signal generation module 321 is utilized for providing a first scan signal SS1_n−1, a second scan signal SS2_n−1 and a first start pulse signal ST1_n−1 according to a first start pulse signal ST1_n−2, a first clock CK1 and a second clock CK2. The emission signal generation module 331 is utilized for providing an emission signal EM_n−1 and a second start pulse signal ST2_n−1 according to a second start pulse signal ST2_n−2, a third clock CK3 and a fourth clock CK4.

The Nth shift register stage 312 includes a scan signal generation module 322 and an emission signal generation module 332. The scan signal generation module 322 is utilized for providing a first scan signal SS1_n, a second scan signal SS2_n and a first start pulse signal ST1_n according to the first start pulse signal ST1_n−1, the first clock CK1 and the second clock CK2. The emission signal generation module 332 is utilized for providing an emission signal EM_n and a second start pulse signal ST2_n according to the second start pulse signal ST2_n−1, the third clock CK3 and the fourth clock CK4. The (N+1)th shift register stage 313 includes a scan signal generation module 323 and an emission signal generation module 333. The scan signal generation module 323 is utilized for providing a first scan signal SS1_n+1, a second scan signal SS2_n+1 and a first start pulse signal ST1_n+1 according to the first start pulse signal ST1_n, the first clock CK1 and the second clock CK2. The emission signal generation module 333 is utilized for providing an emission signal EM_n+1 and a second start pulse signal ST2_n+1 according to the second start pulse signal ST2_n, the third clock CK3 and the fourth clock CK4.

The phase of the second clock CK2 is opposite to that of the first clock CK1. The phase of the fourth clock CK4 is opposite to that of the third clock CK3. The pulse widths of the first scan signals SS1_n−1~SS1_n+1 and the second scan signals SS2_n−1~SS2_n+1 are substantially twice the pulse width of the first clock CK1. The pulse widths of the emission signals EM_n−1~EM_n+1 are substantially identical to the pulse width of the third clock CK3. The first and second scan signals generated by each scan signal generation module have pulses opposite to each other and are synchronized with the first clock CK1. The emission signal generated by each emission signal generation module is synchronized with the third clock CK3. The third clock CK3 is synchronized with the first clock CK1 or lags the first clock CK1 by a phase difference of less than 90 degrees.

The first scan signal SS1_n−1, the second scan signal SS2_n−1 and the emission signal EM_n−1 are furnished to a first scan line LS1_n−1, a second scan line LS2_n−1 and a transmission line LE_n−1 respectively. The first scan signal SS1_n, the second scan signal SS2_n and the emission signal EM_n are furnished to a first scan line LS1_n, a second scan line LS2_n and a transmission line LE_n respectively. The first scan signal SS1_n+1, the second scan signal SS2_n+1 and the emission signal EM_n+1 are furnished to a first scan line LS1_n+1, a second scan line LS2_n+1 and a transmission line LE_n+1 respectively.

The first start pulse signal generated by the scan signal generation module of each shift register stage is used to enable the scan signal generation module of one succeeding shift register stage. For instance, the first start pulse signal ST1_n generated by the scan signal generation module 322 of the Nth shift register stage 312 is used to enable the scan signal generation module 323 of the (N+1)th shift register stage 313. The second start pulse signal generated by the emission signal generation module of each shift register stage is used to enable the emission signal generation module of one succeeding shift register stage. For instance, the second start pulse signal ST2_n generated by the emission signal generation module 332 of the Nth shift register stage 312 is used to enable the emission signal generation module 333 of the (N+1)th shift register stage 313.

Figure 4:
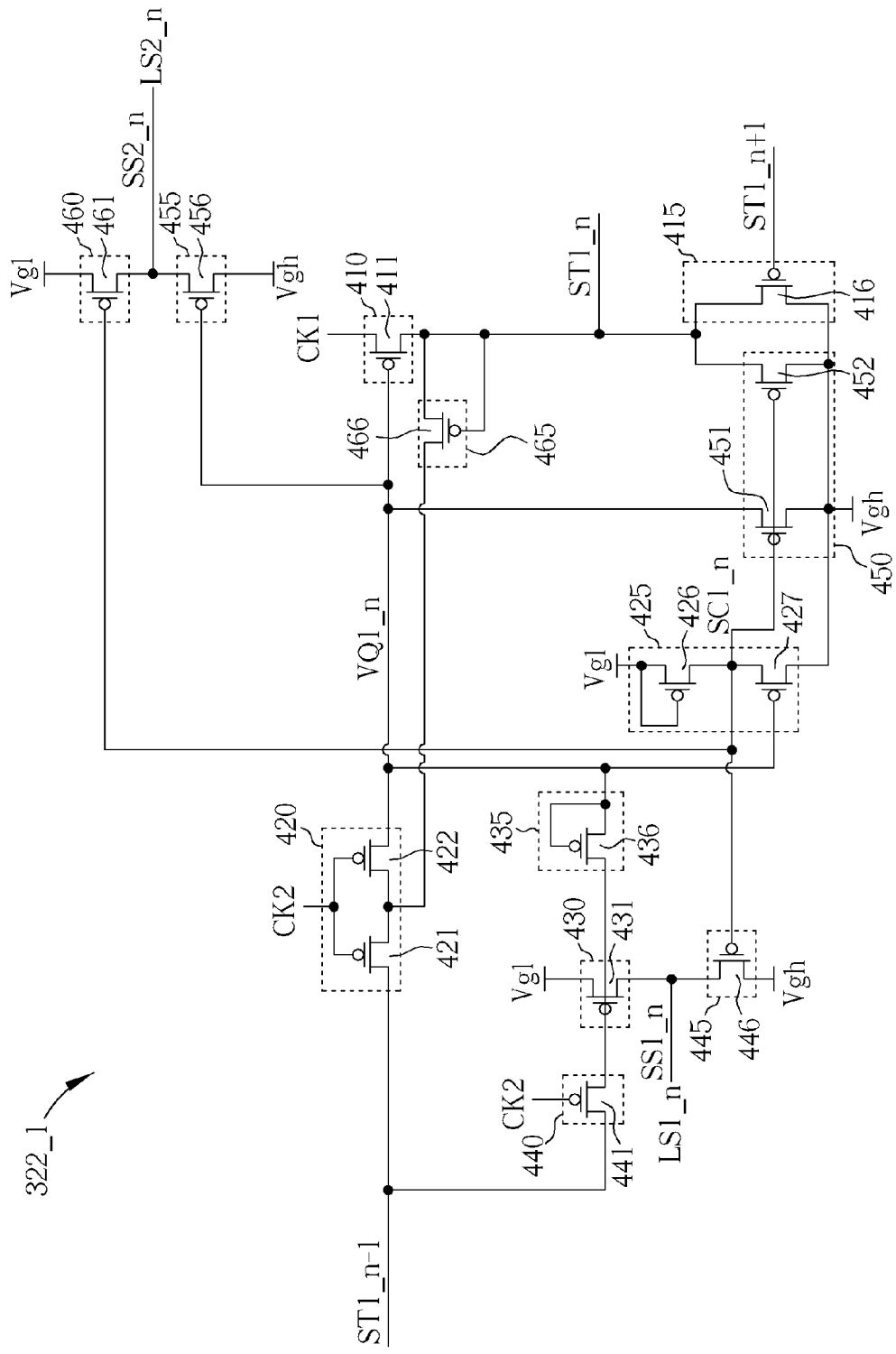
FIG. 4 is a circuit diagram schematically showing a first embodiment of the scan signal generation module in the shift register circuit shown in FIG. 3.

FIG. 4 is a circuit diagram schematically showing a first embodiment of the scan signal generation module in the shift register circuit 300 shown in FIG. 3. As shown in FIG. 4, the scan signal generation module 322_1 of the Nth shift register stage 312 comprises a first pull-down unit 410, a first pull-up unit 415, a first input unit 420, a first control unit 425, a second pull-down unit 430, a buffer unit 435, a second input unit 440, a second pull-up unit 445, a third pull-up unit 450, a fourth pull-up unit 455, a third pull-down unit 460, and a voltage regulation unit 465. The first pull-down unit 410, electrically connected to the first input unit 420, is utilized for pulling down the first start pulse signal ST1_n according to the first clock CK1 and a first driving control voltage VQ1_n. The first pull-up unit 415, electrically connected to the first pull-down unit 410, is utilized for pulling up the first start pulse signal ST1_n according to the first start pulse signal ST1_n+1 provided by the (N+1)th shift register stage 313. The first input unit 420, electrically connected to the first pull-down unit 410, is utilized for inputting the first start pulse signal ST1_n−1 provided by the (N−1)th shift register stage 311 to become the first driving control voltage VQ1_n according to the second clock CK2.

The first control unit 425, electrically connected to the first input unit 420, is utilized for generating a first control signal SC1_n based on the first driving control voltage VQ1_n. In one embodiment, the first control unit 425 is an inverter for inverting the first driving control voltage VQ1_n to generate the first control signal SC1_n. The second pull-down unit 430, electrically connected to the first scan line LS1_n, is utilized for pulling down the first scan signal SS1_n according to the first driving control voltage VQ1_n or the first start pulse signal ST1_n−1. The buffer unit 435, electrically connected to the first input unit 420 and the second pull-down unit 430, is employed to forward the first driving control voltage VQ1_n having low voltage level to the second pull-down unit 430. The second input unit 440, electrically connected to the second pull-down unit 430, is employed to forward the first start pulse signal ST1_n−1 to the second pull-down unit 430 according to the second clock CK2. The second pull-up unit 445, electrically connected to the first scan line LS1_n and the first control unit 425, is utilized for pulling up the first scan signal SS1_n according to the first control signal SC1_n. The third pull-up unit 450, electrically connected to the first control unit 425, is utilized for pulling up the first driving control voltage VQ1_n and the first start pulse signal ST1_n according to the first control signal SC1_n. The fourth pull-up unit 455, electrically connected to the second scan line LS2_n and the first input unit 420, is utilized for pulling up the second scan signal SS2_n according to the first driving control voltage VQ1_n. The third pull-down unit 460, electrically connected to the second scan line LS2_n and the first control unit 425, is utilized for pulling down the second scan signal SS2_n according to the first control signal SC1_n. The voltage regulation unit 465, electrically connected to the first input unit 420 and the first pull-down unit 410, is utilized for stabilizing the first driving control voltage VQ1_n according to the first start pulse signal ST1_n.

In the embodiment shown in FIG. 4, the first pull-down unit 410 comprises a first transistor 411, the first pull-up unit 415 comprises a second transistor 416, the first input unit 420 comprises a third transistor 421 and a fourth transistor 422, the first control unit 425 comprises a fifth transistor 426 and a sixth transistor 427, the second pull-down unit 430 comprises a seventh transistor 431, the buffer unit 435 comprises an eighth transistor 436, the second input unit 440 comprises a ninth transistor 441, the second pull-up unit 445 comprises a tenth transistor 446, the third pull-up unit 450 comprises an eleventh transistor 451 and a twelfth transistor 452, the fourth pull-up unit 455 comprises a thirteenth transistor 456, the third pull-down unit 460 comprises a fourteenth transistor 461, and the voltage regulation unit 465 comprises a fifteenth transistor 466. The first transistor 411 through the fifteenth transistor 466 are thin film transistors, metal oxide semiconductor (MOS) field effect transistors, or junction field effect transistors.

The first transistor 411 comprises a first end for receiving the first clock CK1, a second end for outputting the first start pulse signal ST1_n, and a gate end electrically connected to the first input unit 420 for receiving the first driving control voltage VQ1_n. The second transistor 416 comprises a first end electrically connected to the second end of the first transistor 411, a second end for receiving a high reference voltage Vgh, and a gate end for receiving the first start pulse signal ST1_n+1. The third transistor 421 comprises a first end for receiving the first start pulse signal ST1_n−1, a second end, and a gate end for receiving the second clock CK2. The fourth transistor 422 comprises a first end electrically connected to the second end of the third transistor 421, a gate end electrically connected to the gate end of the third transistor 421, and a second end electrically connected to the gate end of the first transistor 411. The fifth transistor 426 comprises a first end for receiving a low reference voltage Vgl, a gate end electrically connected to the first end, and a second end. The sixth transistor 427 comprises a first end electrically connected to the second end of the fifth transistor 426, a gate end electrically connected to the second end of the fourth transistor 422 for receiving the first driving control voltage VQ1_n, and a second end for receiving the high reference voltage Vgh.

The seventh transistor 431 comprises a first end for receiving the low reference voltage Vgl, a gate end electrically connected to the buffer unit 435 and the second input unit 440, and a second end electrically connected to the first scan line LS1_n. The eighth transistor 436 comprises a first end electrically connected to the second end of the fourth transistor 422 for receiving the first driving control voltage VQ1_n, a gate end electrically connected to the first end, and a second end electrically connected to the gate end of the seventh transistor 431. The ninth transistor 441 comprises a first end for receiving the first start pulse signal ST1_n−1, a gate end for receiving the second clock CK2, and a second end electrically connected to the gate end of the seventh transistor 431. The tenth transistor 446 comprises a first end electrically connected to the first scan line LS1_n, a gate end electrically connected to the second end of the fifth transistor 426, and a second end for receiving the high reference voltage Vgh.

The eleventh transistor 451 comprises a first end electrically connected to the second end of the fourth transistor 422, a gate end electrically connected to the second end of the fifth transistor 426, and a second end for receiving the high reference voltage Vgh. The twelfth transistor 452 comprises a first end electrically connected to the second end of the first transistor 411, a gate end electrically connected to the second end of the fifth transistor 426, and a second end for receiving the high reference voltage Vgh. The thirteenth transistor 456 comprises a first end electrically connected to the second scan line LS2_n, a gate end electrically connected to the second end of the fourth transistor 422 for receiving the first driving control voltage VQ1_n, and a second end for receiving the high reference voltage Vgh. The fourteenth transistor 461 comprises a first end for receiving the low reference voltage Vgl, a gate end electrically connected to the second end of the fifth transistor 426, and a second end electrically connected to the second scan line LS2_n. The fifteenth transistor 466 comprises a first end electrically connected to the second end of the first transistor 411, a gate end electrically connected to the first end, and a second end electrically connected to the first end of the fourth transistor 422.

The fifteenth transistor 466 is capable of forwarding the first start pulse signal ST1_n having low voltage level to the first end of the fourth transistor 422 so that the drain-source voltage drop of the fourth transistor 422 can be reduced for lowering leakage current so as to stabilize the first driving control voltage VQ1_n. In another embodiment, the fifteenth transistor 466 and the fourth transistor 422 are omitted and the second end of the third transistor 421 is connected directly to the gate end of the first transistor 411. In this embodiment, the third transistor 421 with low leakage feature is preferred for stabilizing the first driving control voltage VQ1_n.

Figure 5:
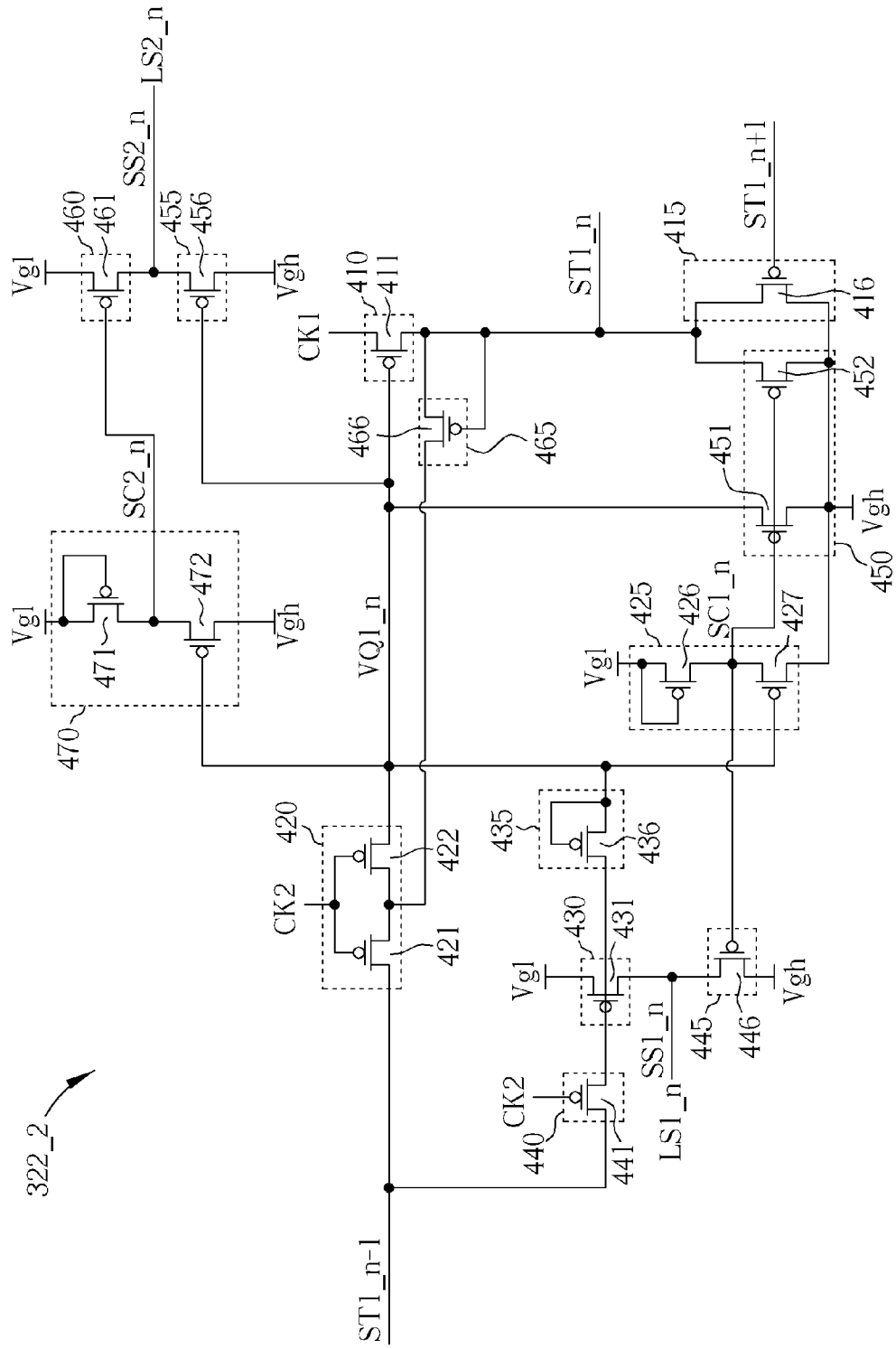
FIG. 5 is a circuit diagram schematically showing a second embodiment of the scan signal generation module in the shift register circuit shown in FIG. 3.

FIG. 5 is a circuit diagram schematically showing a second embodiment of the scan signal generation module in the shift register circuit 300 shown in FIG. 3. As shown in FIG. 5, the scan signal generation module 322_2 of the Nth shift register stage 312 is similar to the scan signal generation module 322_1 shown in FIG. 4, differing in that a second control unit 470 is further added and the gate end of the fourteenth transistor 461 is electrically connected to the second control unit 470 for receiving a second control signal SC2_n. That is, in the scan signal generation module 322_2, the first control signal SC1_n generated by the first control unit 425 is employed only to control the second pull-up unit 445 and the third pull-up unit 450. For that reason, the driving ability of the first control unit 425 can be lowered and the sizes or width/length ratios of the fifth transistor 426 and the sixth transistor 427 used can be reduced accordingly.

The second control unit 470 is electrically connected to the first input unit 420 and functions to generate the second control signal SC2_n based on the first driving control voltage VQ1_n. In one embodiment, the second control unit 470 is an inverter for inverting the first driving control voltage VQ1_n to generate the second control signal SC2_n. In the embodiment shown in FIG. 5, the second control unit 470 comprises a sixteenth transistor 471 and a seventeenth transistor 472, which are thin film transistors, MOS field effect transistors or junction field effect transistors. The sixteenth transistor 471 comprises a first end for receiving the low reference voltage Vgl, a gate end electrically connected to the first end, and a second end electrically connected to the gate end of the fourteenth transistor 461. The seventeenth transistor 472 comprises a first end electrically connected to the second end of the sixteenth transistor 471, a gate end electrically connected to the second end of the fourth transistor 422 for receiving the first driving control voltage VQ1_n, and a second end for receiving the high reference voltage Vgh. Similarly, in another embodiment, the fifteenth transistor 466 and the fourth transistor 422 of the scan signal generation module 322_2 can be omitted.

Figure 6:
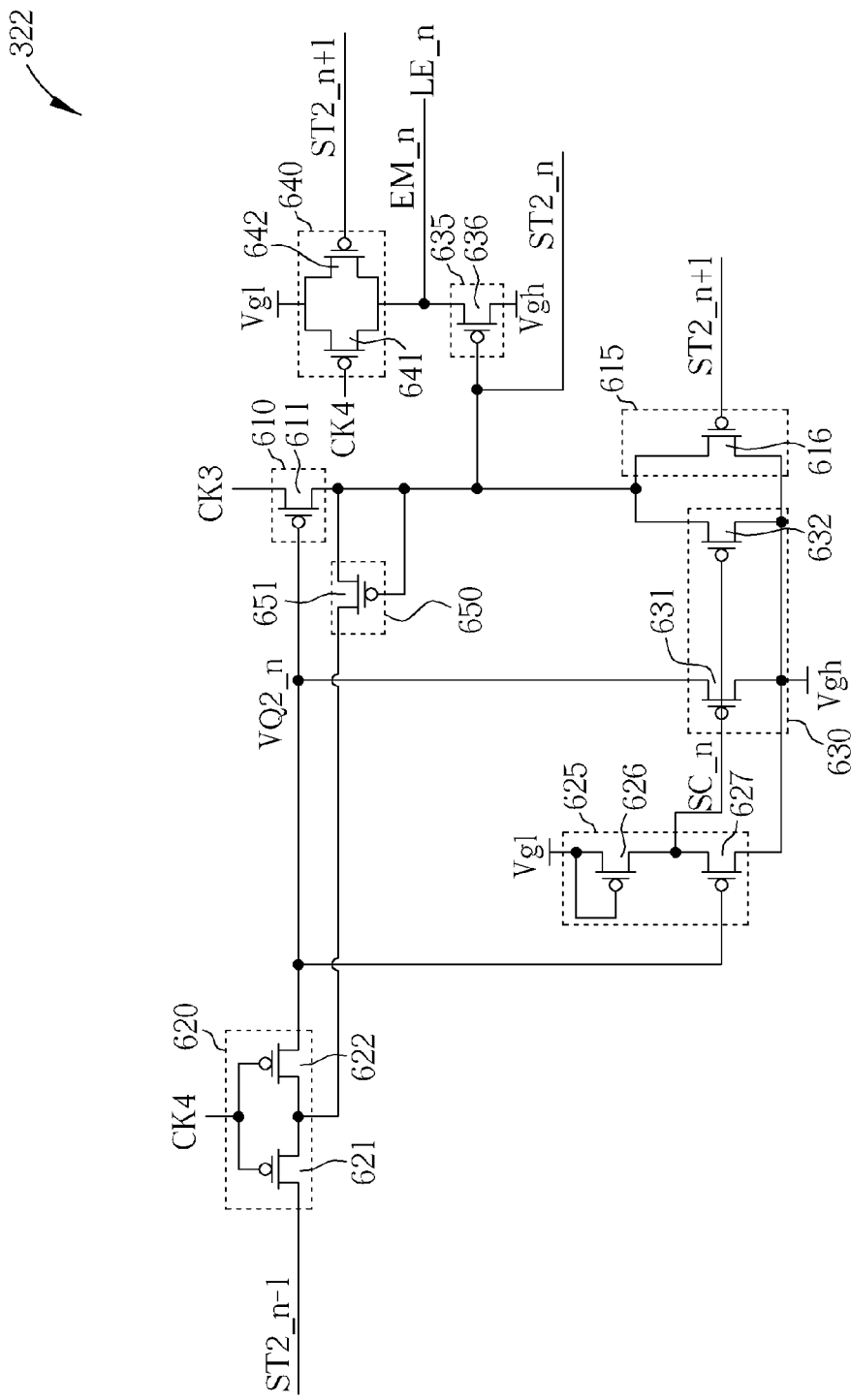
FIG. 6 is a circuit diagram schematically showing a preferred embodiment of the emission signal generation module in the shift register circuit shown in FIG. 3.

FIG. 6 is a circuit diagram schematically showing a preferred embodiment of the emission signal generation module in the shift register circuit 300 shown in FIG. 3. As shown in FIG. 6, the emission signal generation module 332 of the Nth shift register stage 312 comprises a first pull-down unit 610, a first pull-up unit 615, an input unit 620, a control unit 625, a second pull-up unit 630, a third pull-up unit 635, a second pull-down unit 640, and a voltage regulation unit 650. The first pull-down unit 610, electrically connected to the input unit 620, is utilized for pulling down the second start pulse signal ST2_n according to the third clock CK3 and a second driving control voltage VQ2_n. The first pull-up unit 615, electrically connected to the first pull-down unit 610, is utilized for pulling up the second start pulse signal ST2_n according to the second start pulse signal ST2_n+1 provided by the (N+1)th shift register stage 313. The input unit 620, electrically connected to the first pull-down unit 610, is utilized for inputting the second start pulse signal ST2_n−1 provided by the (N−1)th shift register stage 311 to become the second driving control voltage VQ2_n according to the fourth clock CK4.

The control unit 625, electrically connected to the input unit 620, is utilized for generating a control signal SC_n based on the second driving control voltage VQ2_n. In one embodiment, the control unit 625 is an inverter for inverting the second driving control voltage VQ2_n to generate the control signal SC_n. The second pull-up unit 630, electrically connected to the control unit 625, is utilized for pulling up the second driving control voltage VQ2_n and the second start pulse signal ST2_n according to the control signal SC_n. The third pull-up unit 635, electrically connected to the transmission line LE_n and the first pull-down unit 610, is utilized for pulling up the emission signal EM_n according to the second start pulse signal ST2_n. The second pull-down unit 640, electrically connected to the transmission line LE_n, is utilized for pulling down the emission signal EM_n according to the fourth clock CK4 or the second start pulse signal ST2_n+1. The voltage regulation unit 650, electrically connected to the input unit 620 and the first pull-down unit 610, is utilized for stabilizing the second driving control voltage VQ2_n according to the second start pulse signal ST2_n.

In the embodiment shown in FIG. 6, the first pull-down unit 610 comprises a first transistor 611, the first pull-up unit 615 comprises a second transistor 616, the input unit 620 comprises a third transistor 621 and a fourth transistor 622, the control unit 625 comprises a fifth transistor 626 and a sixth transistor 627, the second pull-up unit 630 comprises a seventh transistor 631 and an eighth transistor 632, the third pull-up unit 635 comprises a ninth transistor 636, the second pull-down unit 640 comprises a tenth transistor 641 and an eleventh transistor 642, and the voltage regulation unit 650 comprises a twelfth transistor 651. The first transistor 611 through the twelfth transistor 651 are thin film transistors, MOS field effect transistors, or junction field effect transistors.

The first transistor 611 comprises a first end for receiving the third clock CK3, a second end for outputting the second start pulse signal ST2_n, and a gate end electrically connected to the input unit 620 for receiving the second driving control voltage VQ2_n. The second transistor 616 comprises a first end electrically connected to the second end of the first transistor 611, a second end for receiving a high reference voltage Vgh, and a gate end for receiving the second start pulse signal ST2_n+1. The third transistor 621 comprises a first end for receiving the second start pulse signal ST2_n−1, a second end, and a gate end for receiving the fourth clock CK4. The fourth transistor 622 comprises a first end electrically connected to the second end of the third transistor 621, a gate end electrically connected to the gate end of the third transistor 621, and a second end electrically connected to the gate end of the first transistor 611. The fifth transistor 626 comprises a first end for receiving a low reference voltage Vgl, a gate end electrically connected to the first end, and a second end. The sixth transistor 627 comprises a first end electrically connected to the second end of the fifth transistor 626, a gate end electrically connected to the second end of the fourth transistor 622 for receiving the second driving control voltage VQ2_n, and a second end for receiving the high reference voltage Vgh.

The seventh transistor 631 comprises a first end electrically connected to the second end of the fourth transistor 622, a gate end electrically connected to the second end of the fifth transistor 626, and a second end for receiving the high reference voltage Vgh. The eighth transistor 632 comprises a first end electrically connected to the second end of the first transistor 611, a gate end electrically connected to the second end of the fifth transistor 626, and a second end for receiving the high reference voltage Vgh. The ninth transistor 636 comprises a first end electrically connected to the transmission line LE_n, a gate end electrically connected to the second end of the first transistor 611 for receiving the second start pulse signal ST2_n, and a second end for receiving the high reference voltage Vgh. The tenth transistor 641 comprises a first end for receiving the low reference voltage Vgl, a gate end for receiving the fourth clock CK4, and a second end electrically connected to the transmission line LE_n. The eleventh transistor 642 comprises a first end for receiving the low reference voltage Vgl, a gate end for receiving the second start pulse signal ST2_n+1, and a second end electrically connected to the transmission line LE_n. The twelfth transistor 651 comprises a first end electrically connected to the second end of the first transistor 611, a gate end electrically connected to the first end, and a second end electrically connected to the first end of the fourth transistor 622.

The twelfth transistor 651 is capable of forwarding the second start pulse signal ST2_n having low voltage level to the first end of the fourth transistor 622 so that the drain-source voltage drop of the fourth transistor 622 can be reduced for lowering leakage current so as to stabilize the second driving control voltage VQ2_n. In another embodiment, the twelfth transistor 651 and the fourth transistor 622 are omitted and the second end of the third transistor 621 is connected directly to the gate end of the first transistor 611. In this embodiment, the third transistor 621 with low leakage feature is preferred for stabilizing the second driving control voltage VQ2_n.

Figure 7:
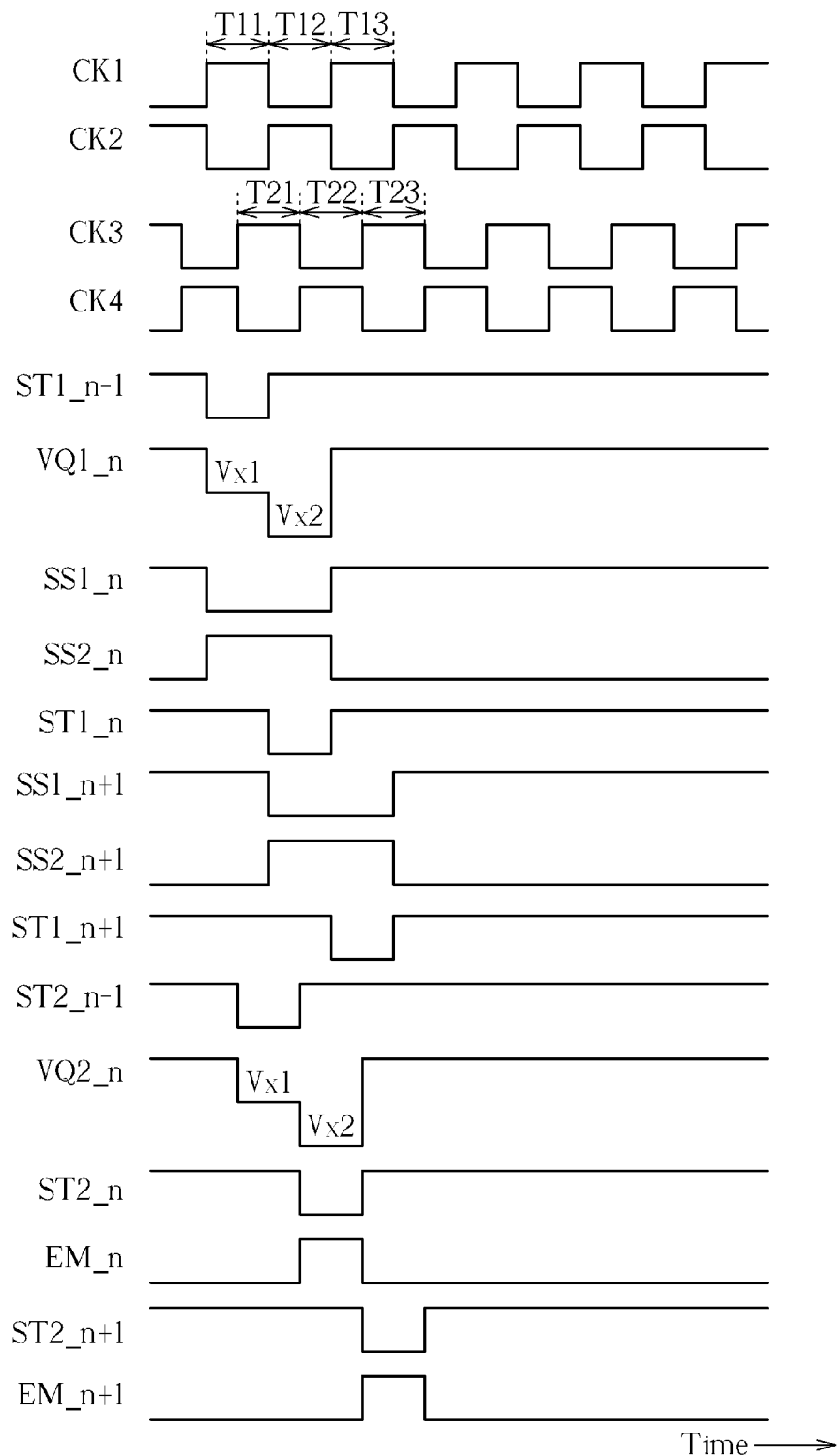
FIG. 7 is a schematic diagram showing related signal waveforms regarding the operation of the shift register circuit shown in FIG. 3, having time along the abscissa.

FIG. 7 is a schematic diagram showing related signal waveforms regarding the operation of the shift register circuit 300 shown in FIG. 3, having time along the abscissa. The signal waveforms in FIG. 7, from top to bottom, are the first clock CK1, the second clock CK2, the third clock CK3, the fourth clock CK4, the first start pulse signal ST1_n−1, the first driving control voltage VQ1_n, the first scan signal SS1_n, the second scan signal SS2_n, the first start pulse signal ST1_n, the first scan signal SS1_n+1, the second scan signal SS2_n+1, the first start pulse signal ST1_n+1, the second start pulse signal ST2_n−1, the second driving control voltage VQ2_n, the second start pulse signal ST2_n, the emission signal EM_n, the second start pulse signal ST2_n+1, and the emission signal EM_n+1. The signal waveforms of the first start pulse signals, the first driving control voltages, the first scan signals and the second scan signals shown in FIG. 7 are generated according to the scan signal generation module 322_1 in FIG. 4 or the scan signal generation module 322_2 in FIG. 5. The signal waveforms of the second start pulse signals and the emission signals shown in FIG. 7 are generated according to the emission signal generation module 332 in FIG. 6.

Referring to FIG. 7 together with FIG. 4, during an interval T11, both the first start pulse signal ST1_n−1 and the second clock CK2 are switching from high voltage level to low voltage level, the third transistor 421 and the fourth transistor 422 are then turned on for pulling down the first driving control voltage VQ1_n to a first low voltage level Vx1. In the meantime, the sixth transistor 427 is turned on by the first driving control voltage VQ1_n having the first low voltage level Vx1 for pulling up the first control signal SC1_n to the high reference voltage Vgh so as to turn off the tenth transistor 446, the eleventh transistor 451, the twelfth transistor 452 and the fourteenth transistor 461. Also, the eighth transistor 436 is turned on by the first driving control voltage VQ1_n having the first low voltage level Vx1 for furnishing the first driving control voltage VQ1_n having the first low voltage level Vx1 to the gate end of the seventh transistor 431. Meanwhile, the first start pulse signal ST1_n−1 having low voltage level can be forwarded to the gate end of the seventh transistor 431 via the ninth transistor 441 turned on by the second clock CK2. That is, the seventh transistor 431 is turned on for pulling down the first scan signal SS1_n to the low reference voltage Vgl. Besides, the thirteenth transistor 456 is turned on by the first driving control voltage VQ1_n having the first low voltage level Vx1 for pulling up the second scan signal SS2_n to the high reference voltage Vgh.

During an interval T12, both the first start pulse signal ST1_n−1 and the second clock CK2 are switching from low voltage level to high voltage level, the third transistor 421 and the fourth transistor 422 are then turned off and the first driving control voltage VQ1_n becomes a floating voltage. Concurrently, along with the switching of the first clock CK1 from high voltage level to low voltage level, the first driving control voltage VQ1_n is further pulled down from the first low voltage level Vx1 to a second low voltage level Vx2 due to a capacitive coupling effect caused by the device capacitor of the first transistor 411. Accordingly, the first transistor 411 is turned on for pulling down the first start pulse signal ST1_n from high voltage level to low voltage level; meanwhile, the sixth transistor 427 is still turned on by the first driving control voltage VQ1_n having the second low voltage level Vx2 so as to continue pulling up the first control signal SC1_n to the high reference voltage Vgh. For that reason, the first scan signal SS1_n continues holding the low reference voltage Vgl and the second scan signal SS2_n continues holding the high reference voltage Vgh. It is noted that the fifteenth transistor 466 is turned on by the first start pulse signal ST1_n having low voltage level during the interval T12; in turn, the voltage at the first end of the fourth transistor 422 is pulled down so that the drain-source voltage drop of the fourth transistor 422 can be reduced for lowering leakage current so as to stabilize the first driving control voltage VQ1_n.

During an interval T13, the first start pulse signal ST1_n−1 holds high voltage level and the second clock CK2 is switching to low voltage level, the third transistor 421 and the fourth transistor 422 are then turned on for pulling up the first driving control voltage VQ1_n to high voltage level so that the sixth transistor 427 is turned off for switching the first control signal SC1_n to the low reference voltage Vgl. Accordingly, the tenth transistor 446, the eleventh transistor 451, the twelfth transistor 452 and the fourteenth transistor 461 are turned on for pulling up the first scan signal SS1_n, the first driving control voltage VQ1_n and the first start pulse signal ST1_n to the high reference voltage Vgh and for pulling down the second scan signal SS2_n to the low reference voltage Vgl. Besides, the first start pulse signal ST1_n having low voltage level during the interval T12 is further employed to enable the scan signal generation module 323 of the (N+1)th shift register stage 313 for generating the first start pulse signal ST1_n+1 having low voltage level during the interval T13, and therefore the second transistor 416 is also turned on for pulling up the first start pulse signal ST1_n to the high reference voltage Vgh during the interval T13.

As shown in FIG. 7, it is noted that the first scan signal SS1_n and the second scan signal SS2_n have pulses opposite to each other and are synchronized with the first clock CK1. In addition, the pulse widths of the first scan signal SS1_n and the second scan signal SS2_n are substantially twice the pulse width of the first clock CK1. Regarding the circuit operation of the scan signal generation module 322_2, the waveform of the second control signal SC2_n is substantially identical to that of the first control signal SC1_n. That is, the circuit operation of the scan signal generation module 322_2 is essentially identical to that of the scan signal generation module 322_1, and for the sake of brevity, further similar discussion thereof is omitted.

Referring to FIG. 7 together with FIG. 6, during an interval T21, both the second start pulse signal ST2_n−1 and the fourth clock CK4 are switching from high voltage level to low voltage level, the third transistor 621 and the fourth transistor 622 are then turned on for pulling down the second driving control voltage VQ2_n to the first low voltage level Vx1. In the meantime, the sixth transistor 627 is turned on by the second driving control voltage VQ2_n having the first low voltage level Vx1 for pulling up the control signal SC_n to the high reference voltage Vgh so as to turn off the seventh transistor 631 and the eighth transistor 632.

During an interval T22, both the second start pulse signal ST2_n−1 and the fourth clock CK4 are switching from low voltage level to high voltage level, the third transistor 621 and the fourth transistor 622 are then turned off and the second driving control voltage VQ2_n becomes a floating voltage. Concurrently, along with the switching of the third clock CK3 from high voltage level to low voltage level, the second driving control voltage VQ2_n is further pulled down from the first low voltage level Vx1 to the second low voltage level Vx2 due to a capacitive coupling effect caused by the device capacitor of the first transistor 611. Accordingly, the first transistor 611 is turned on for pulling down the second start pulse signal ST2_n from high voltage level to low voltage level; in turn, the ninth transistor 636 is turned on for pulling up the emission signal EM_n to the high reference voltage Vgh. Meanwhile, the sixth transistor 627 is still turned on by the second driving control voltage VQ2_n having the second low voltage level Vx2 so as to continue pulling up the control signal SC_n to the high reference voltage Vgh. For that reason, both the seventh transistor 631 and the eighth transistor 632 are retained to be in turn-off state. It is noted that the twelfth transistor 650 is turned on by the second start pulse signal ST2_n having low voltage level during the interval T22; in turn, the voltage at the first end of the fourth transistor 622 is pulled down so that the drain-source voltage drop of the fourth transistor 622 can be reduced for lowering leakage current so as to stabilize the second driving control voltage VQ2_n.

During an interval T23, the second start pulse signal ST2_n−1 holds high voltage level and the fourth clock CK4 is switching to low voltage level, the third transistor 621 and the fourth transistor 622 are then turned on for pulling up the second driving control voltage VQ2_n to high voltage level so that the sixth transistor 627 is turned off for switching the control signal SC_n to the low reference voltage Vgl. Accordingly, the seventh transistor 631 and the eighth transistor 632 are turned on for pulling up the second driving control voltage VQ2_n and the second start pulse signal ST2_n to the high reference voltage Vgh. Furthermore, the ninth transistor 636 is turned off by the second start pulse signal ST2_n having the high reference voltage Vgh. Concurrently, along with the switching of the fourth clock CK4 from high voltage level to low voltage level, the tenth transistor 641 is turned on for pulling down the emission signal EM_n to the low reference voltage Vgl. Besides, the second start pulse signal ST2_n having low voltage level during the interval T22 is further employed to enable the emission signal generation module 333 of the (N+1)th shift register stage 313 for generating the second start pulse signal ST2_n+1 having low voltage level during the interval T23. Therefore, during the interval T23, the second transistor 616 is turned on for pulling up the second start pulse signal ST2_n to the high reference voltage Vgh and the eleventh transistor 642 is turned on for pulling down the emission signal EM_n to the low reference voltage Vgl. As shown in FIG. 7, it is noted that the emission signal EM_n is synchronized with the third clock CK3. In addition, the pulse width of the emission signal EM_n is substantially identical to that of the third clock CK3.

Figure 8:
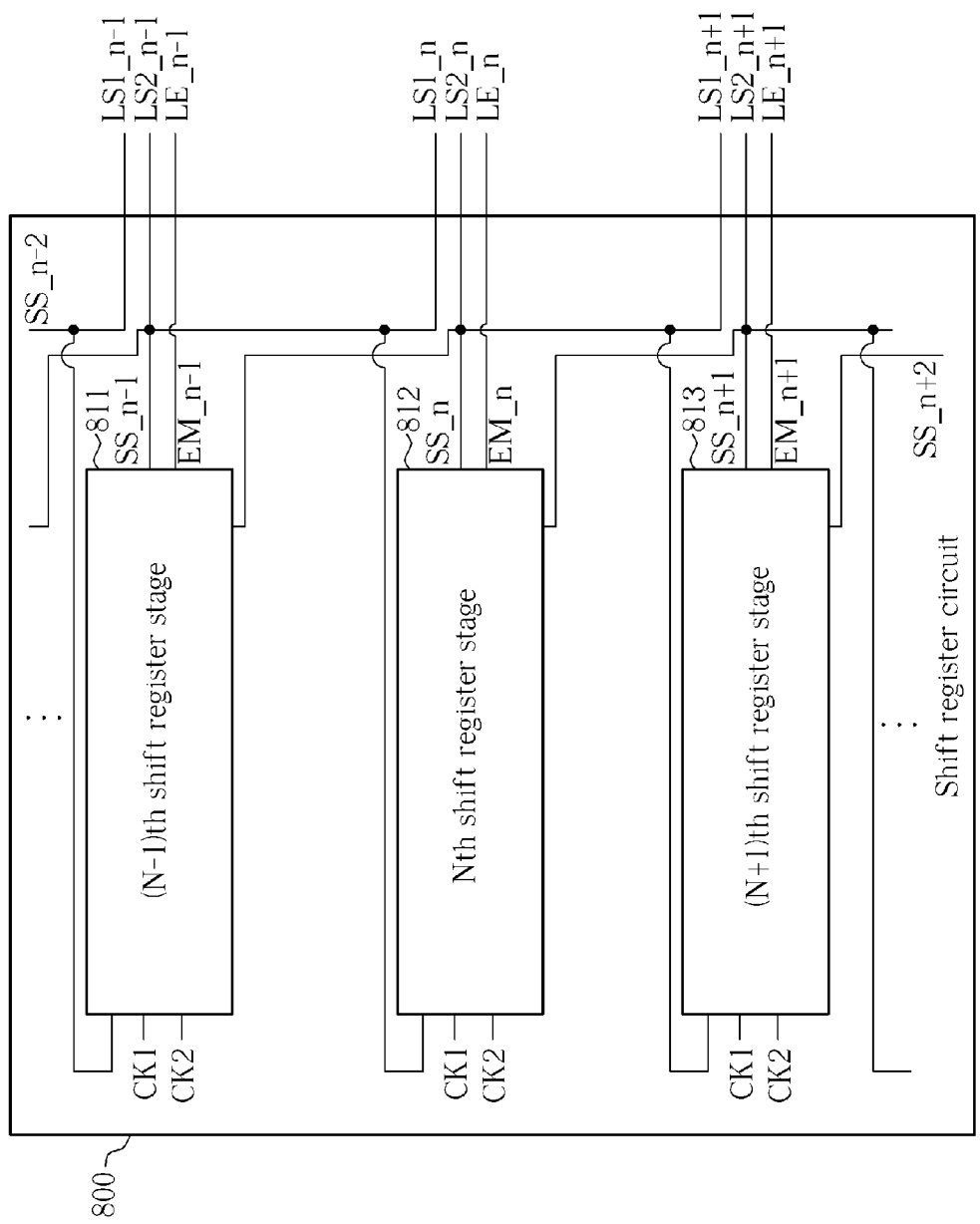
FIG. 8 is a structural diagram schematically showing a shift register circuit in accordance with a second embodiment of the present invention.

FIG. 8 is a structural diagram schematically showing a shift register circuit 800 in accordance with a second embodiment of the present invention. As shown in FIG. 8, the shift register circuit 800 comprises a plurality of shift register stages for generating plural scan signals and plural emission signals according to a first clock CK1 and a second clock CK2 having a phase opposite to the first clock CK1. For ease of explanation, the shift register circuit 800 illustrates an (N−1)th shift register stage 811, an Nth shift register stage 812, and an (N+1)th shift register stage 813. The (N−1)th shift register stage 811 is employed to provide a scan signal SS_n−1 and an emission signal EM_n−1 by making use of a scan signal SS_n−2 as a start pulse signal. The Nth shift register stage 812 is employed to provide a scan signal SS_n and an emission signal EM_n by making use of the scan signal SS_n−1 as a start pulse signal. The (N+1)th shift register stage 813 is employed to provide a scan signal SS_n+1 and an emission signal EM_n+1 by making use of the scan signal SS_n as a start pulse signal. The pulse widths of the scan signals SS_n−1~SS_n+1 are substantially identical to the pulse width of the first clock CK1. The pulse widths of the emission signals EM_n−1~EM_n+1 are substantially twice the pulse width of the first clock CK1. The scan signal and the emission signal generated by each shift register stage are synchronized with the first clock CK1.

The scan signals SS_n−2, SS_n−1 and the emission signal EM_n−1 are furnished to a first scan line LS1_n−1, a second scan line LS2_n−1 and a transmission line LE_n−1 respec-tively. The scan signals SS_n−1, SS_n and the emission signal EM_n are furnished to a first scan line LS1_n, a second scan line LS2_n and a transmission line LE_n respectively. The scan signals SS_n, SS_n+1 and the emission signal EM_n+1 are furnished to a first scan line LS1_n+1, a second scan line LS2_n+1 and a transmission line LE_n+1 respectively.

Figure 9:
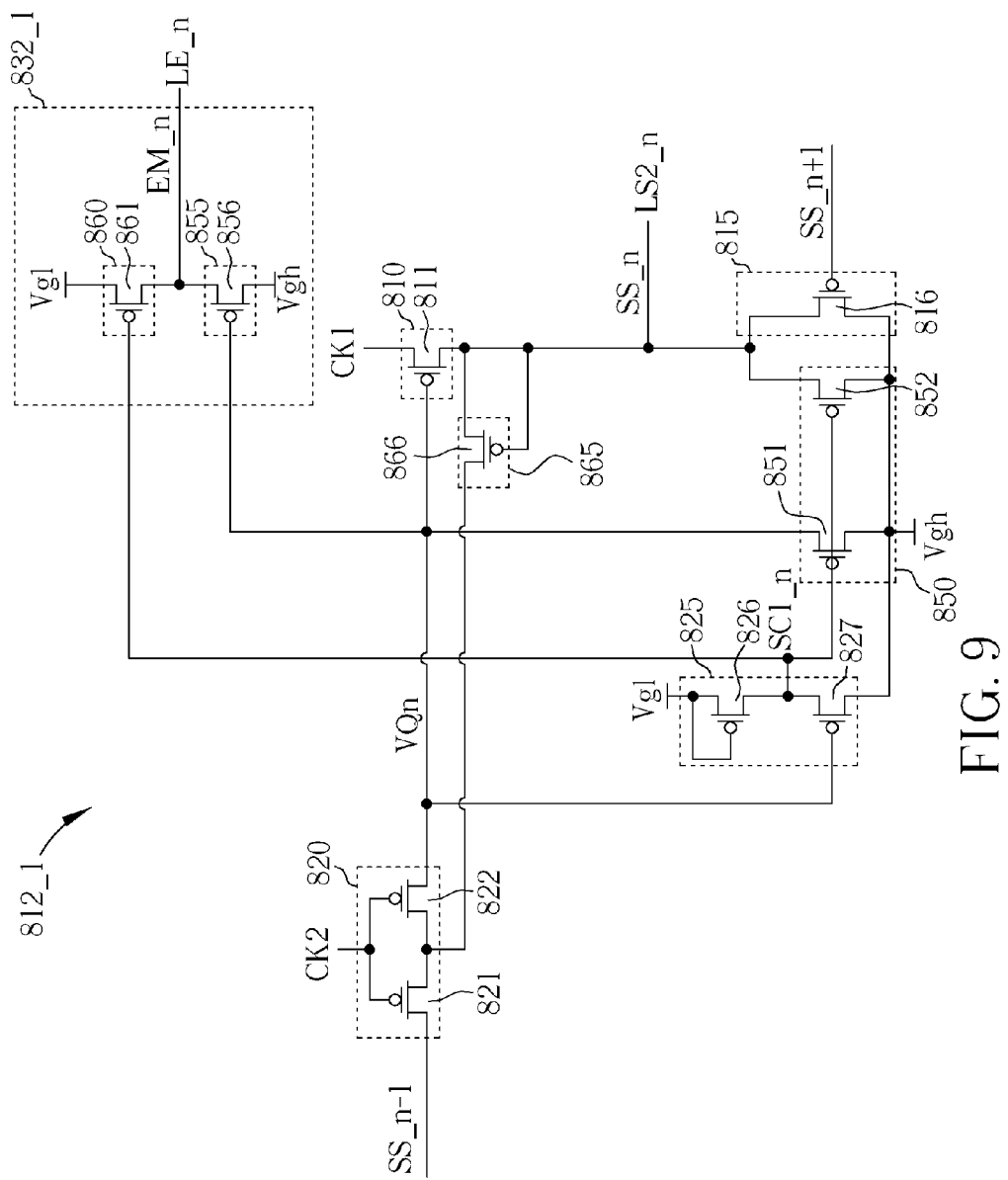
FIG. 9 is a circuit diagram schematically showing a first embodiment of the Nth shift register stage in the shift register circuit shown in FIG. 8.

FIG. 9 is a circuit diagram schematically showing a first embodiment of the Nth shift register stage in the shift register circuit 800 shown in FIG. 8. As shown in FIG. 9, the Nth shift register stage 812_1 comprises a first pull-down unit 810, a first pull-up unit 815, an input unit 820, a first control unit 825, a second pull-up unit 850, a voltage regulation unit 865, and an emission signal generation module 832_1. The emission signal generation module 832_1 comprises a second pull-down unit 860 and a third pull-up unit 855. The first pull-down unit 810, electrically connected to the input unit 820, is utilized for pulling down the scan signal SS_n according to the first clock CK1 and a driving control voltage VQn. The first pull-up unit 815, electrically connected to the first pull-down unit 810, is utilized for pulling up the scan signal SS_n according to the scan signal SS_n+1 provided by the (N+1)th shift register stage 813. The input unit 820, electrically connected to the first pull-down unit 810, is utilized for inputting the scan signal SS_n−1 provided by the (N−1)th shift register stage 811 to become the driving control voltage VQn according to the second clock CK2.

The first control unit 825, electrically connected to the input unit 820, is utilized for generating a first control signal SC1_n based on the driving control voltage VQn. In one embodiment, the first control unit 825 is an inverter for inverting the driving control voltage VQn to generate the first control signal SC1_n. The second pull-up unit 850, electrically connected to the first control unit 825, is utilized for pulling up the driving control voltage VQn and the scan signal SS_n according to the first control signal SC1_n. The voltage regulation unit 865, electrically connected to the input unit 820 and the first pull-down unit 810, is utilized for stabilizing the driving control voltage VQn according to the scan signal SS_n. The second pull-down unit 860, electrically connected to the transmission line LE_n and the first control unit 825, is utilized for pulling down the emission signal EM_n according to the first control signal SC1_n. The third pull-up unit 855, electrically connected to the transmission line LE_n and the input unit 820, is utilized for pulling up the emission signal EM_n according to the driving control voltage VQn.

In the embodiment shown in FIG. 9, the first pull-down unit 810 comprises a first transistor 811, the first pull-up unit 815 comprises a second transistor 816, the input unit 820 comprises a third transistor 821 and a fourth transistor 822, the first control unit 825 comprises a fifth transistor 826 and a sixth transistor 827, the second pull-up unit 850 comprises a seventh transistor 851 and an eighth transistor 852, the second pull-down unit 860 comprises a ninth transistor 861, the third pull-up unit 855 comprises a tenth transistor 856, and the voltage regulation unit 865 comprises an eleventh transistor 866. The first transistor 811 through the eleventh transistor 866 are thin film transistors, MOS field effect transistors, or junction field effect transistors.

The first transistor 811 comprises a first end for receiving the first clock CK1, a second end for outputting the scan signal SS_n, and a gate end electrically connected to the input unit 820 for receiving the driving control voltage VQn. The second transistor 816 comprises a first end electrically connected to the second end of the first transistor 811, a second end for receiving a high reference voltage Vgh, and a gate end for receiving the scan signal SS_n+1. The third transistor 821 comprises a first end for receiving the scan signal SS_n−1, a gate end for receiving the second clock CK2, and a second end. The fourth transistor 822 comprises a first end electrically connected to the second end of the third transistor 821, a gate end electrically connected to the gate end of the third transistor 821, and a second end electrically connected to the gate end of the first transistor 811. The fifth transistor 826 comprises a first end for receiving a low reference voltage Vgl, a gate end electrically connected to the first end, and a second end. The sixth transistor 827 comprises a first end electrically connected to the second end of the fifth transistor 826, a gate end electrically connected to the second end of the fourth transistor 822 for receiving the driving control voltage VQn, and a second end for receiving the high reference voltage Vgh.

The seventh transistor 851 comprises a first end electrically connected to the second end of the fourth transistor 822, a gate end electrically connected to the second end of the fifth transistor 826, and a second end for receiving the high reference voltage Vgh. The eighth transistor 852 comprises a first end electrically connected to the second end of the first transistor 811, a gate end electrically connected to the second end of the fifth transistor 826, and a second end for receiving the high reference voltage Vgh. The ninth transistor 861 comprises a first end for receiving the low reference voltage Vgl, a gate end electrically connected to the second end of the fifth transistor 826, and a second end electrically connected to the transmission line LE_n. The tenth transistor 856 comprises a first end electrically connected to the transmission line LE_n, a gate end electrically connected to the second end of the fourth transistor 822 for receiving the driving control voltage VQn, and a second end for receiving the high reference voltage Vgh. The eleventh transistor 866 comprises a first end electrically connected to the second end of the first transistor 811, a gate end electrically connected to the first end, and a second end electrically connected to the first end of the fourth transistor 822.

The eleventh transistor 866 is capable of forwarding the scan signal SS_n having low voltage level to the first end of the fourth transistor 822 so that the drain-source voltage drop of the fourth transistor 822 can be reduced for lowering leakage current so as to stabilize the driving control voltage VQn. In another embodiment, the eleventh transistor 866 and the fourth transistor 822 are omitted and the second end of the third transistor 821 is connected directly to the gate end of the first transistor 811. In this embodiment, the third transistor 821 with low leakage feature is preferred for stabilizing the driving control voltage VQn.

Figure 10:
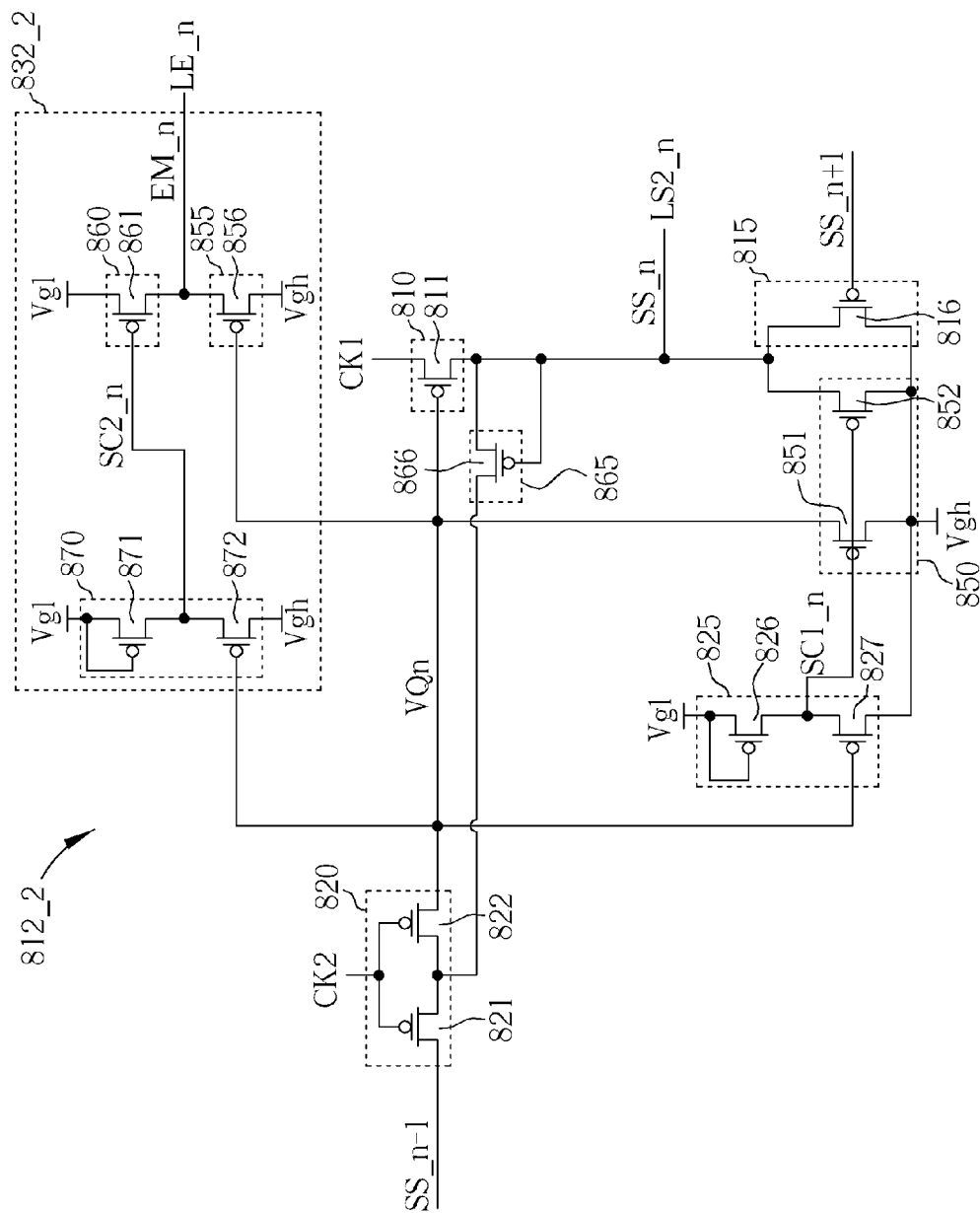
FIG. 10 is a circuit diagram schematically showing a second embodiment of the Nth shift register stage in the shift register circuit shown in FIG. 8.

FIG. 10 is a circuit diagram schematically showing a second embodiment of the Nth shift register stage in the shift register circuit shown 800 in FIG. 8. As shown in FIG. 10, the Nth shift register stage 812_2 is similar to the Nth shift register stage 812_1 shown in FIG. 9, differing in that the emission signal generation module 832_1 is replaced with the emission signal generation module 832_2. Compared with the emission signal generation module 832_1, the emission signal generation module 832_2 further includes a second control unit 870 and the gate end of the ninth transistor 861 is electrically connected to the second control unit 870 for receiving a second control signal SC2_n. That is, in the Nth shift register stage 812_2, the first control signal SC1_n generated by the first control unit 825 is employed only to control the second pull-up unit 850. For that reason, the driving ability of the first control unit 825 can be lowered and the sizes or width/length ratios of the fifth transistor 826 and the sixth transistor 827 used can be reduced accordingly.

The second control unit 870 is electrically connected to the input unit 820 and functions to generate the second control signal SC2_n based on the driving control voltage VQn. In one embodiment, the second control unit 870 is an inverter for inverting the driving control voltage VQn to generate the second control signal SC2_n. In the embodiment shown in FIG. 10, the second control unit 870 comprises a twelfth transistor 871 and a thirteenth transistor 872, which are thin film transistors, MOS field effect transistors or junction field effect transistors. The twelfth transistor 871 comprises a first end for receiving the low reference voltage Vgl, a gate end electrically connected to the first end, and a second end electrically connected to the gate end of the ninth transistor 861. The thirteenth transistor 872 comprises a first end electrically connected to the second end of the twelfth transistor 871, a gate end electrically connected to the second end of the fourth transistor 822 for receiving the driving control voltage VQn, and a second end for receiving the high reference voltage Vgh. Similarly, in another embodiment, the eleventh transistor 866 and the fourth transistor 822 of the Nth shift register stage 812_2 can be omitted.

Figure 11:
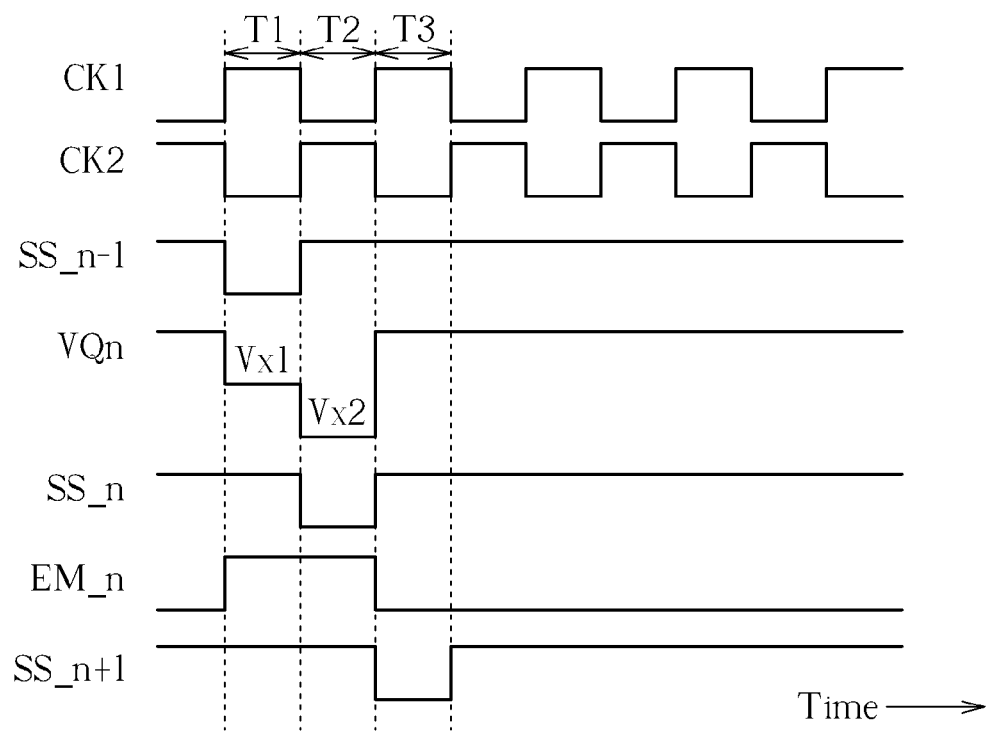
FIG. 11 is a schematic diagram showing related signal waveforms regarding the operation of the shift register circuit shown in FIG. 8, having time along the abscissa.

FIG. 11 is a schematic diagram showing related signal waveforms regarding the operation of the shift register circuit 800 shown in FIG. 8, having time along the abscissa. The signal waveforms in FIG. 11, from top to bottom, are the first clock CK1, the second clock CK2, the scan signal SS_n−1, the driving control voltage VQn, the scan signal SS_n, the emission signal EM_n, and the scan signal SS_n+1. The signal waveforms of the driving control voltage, the scan signals and the emission signal shown in FIG. 11 are generated according to the Nth shift register stage 812_1 in FIG. 9 or the Nth shift register stage 812_2 in FIG. 10.

Referring to FIG. 11 together with FIG. 9, during an interval T1, both the scan signal SS_n−1 and the second clock CK2 are switching from high voltage level to low voltage level, the third transistor 821 and the fourth transistor 822 are then turned on for pulling down the driving control voltage VQn to a first low voltage level Vx1. In the meantime, the sixth transistor 827 is turned on by the driving control voltage VQn having the first low voltage level Vx1 for pulling up the first control signal SC1_n to the high reference voltage Vgh so as to turn off the seventh transistor 851, the eighth transistor 852 and the ninth transistor 861. Also, the tenth transistor 856 is turned on by the driving control voltage VQn having the first low voltage level Vx1 for pulling up the emission signal EM_n to the high reference voltage Vgh.

During an interval T2, both the scan signal SS_n−1 and the second clock CK2 are switching from low voltage level to high voltage level, the third transistor 821 and the fourth transistor 822 are then turned off and the driving control voltage VQn becomes a floating voltage. Concurrently, along with the switching of the first clock CK1 from high voltage level to low voltage level, the driving control voltage VQn is further pulled down from the first low voltage level Vx1 to a second low voltage level Vx2 due to a capacitive coupling effect caused by the device capacitor of the first transistor 811. Accordingly, the first transistor 811 is turned on for pulling down the scan signal SS_n from high voltage level to low voltage level; meanwhile, the sixth transistor 827 and the tenth transistor 856 are still turned on by the driving control voltage VQn having the second low voltage level Vx2. For that reason, the first control signal SC1_n and the emission signal EM_n continue holding the high reference voltage Vgh. It is noted that the eleventh transistor 866 is turned on by the scan signal SS_n having low voltage level during the interval T2; in turn, the voltage at the first end of the fourth transistor 822 is pulled down so that the drain-source voltage drop of the fourth transistor 822 can be reduced for lowering leakage current so as to stabilize the driving control voltage VQn.

During an interval T3, the scan signal SS_n−1 holds high voltage level and the second clock CK2 is switching to low voltage level, the third transistor 821 and the fourth transistor 822 are then turned on for pulling up the driving control voltage VQn to high voltage level so that the sixth transistor 827 is turned off for switching the first control signal SC1_n to the low reference voltage Vgl. Accordingly, the seventh transistor 851, the eighth transistor 852 and the ninth transistor 861 are turned on for pulling up the driving control voltage VQn and the scan signal SS_n to the high reference voltage Vgh and for pulling down the emission signal EM_n to the low reference voltage Vgl. Besides, the scan signal SS_n having low voltage level during the interval T2 is further employed to enable the (N+1)th shift register stage 813 for generating the scan signal SS_n+1 having low voltage level during the interval T3, and therefore the second transistor 816 is also turned on for pulling up the scan signal SS_n to the high reference voltage Vgh during the interval T3.

As shown in FIG. 11, it is noted that the pulse widths of the scan signals SS_n−1~SS_n+1 are substantially identically to the pulse width of the first clock CK1. The pulse width of the emission signal EM_n is substantially twice the pulse width of the first clock CK1. In the circuit operation of the Nth shift register stage 812_2 shown in FIG. 10, the waveform of the second control signal SC2_n is substantially identical to that of the first control signal SC1_n. That is, the circuit operation of the Nth shift register stage 812_2 is essentially identical to that of the Nth shift register stage 812_1, and for the sake of brevity, further similar discussion thereof is omitted.

In conclusion, the shift register circuit of the present invention is capable of generating scan signals and emission signals appropriate to drive pixel units with threshold compensation mechanism. And the pulse widths of the scan signals or the emission signals are substantially twice the pulse width of system clock so that the threshold compensation mechanism in the pixel units is able to work efficiently for enhancing the image quality of flat panel displays.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit comprising a plurality of shift register stages, each of the shift register stages comprising:
    a scan signal generation module, electrically connected to a first scan line and a second scan line, for generating a first scan signal and a second scan signal which have pulses opposite to each other according to a first clock and a second clock having a phase opposite to the first clock, the first and second scan signals being furnished to the first and second scan lines respectively, wherein a pulse width of the first scan signal is substantially twice as wide as a pulse width of the first clock, and the scan signal generation module comprises:
    a first pull-down unit for pulling down an Nth start pulse signal according to a driving control voltage and the first clock;
    a first pull-up unit for pulling up the Nth start pulse signal according to an (N+1)th start pulse signal;
    a first input unit, electrically connected to the first pull-down unit, for inputting an (N−1)th start pulse signal to become the driving control voltage according to the second clock;
    a first control unit, electrically connected to the first input unit, for generating a first control signal according to the driving control voltage;
    a second pull-down unit, electrically connected to the first scan line, for pulling down the first scan signal according to the driving control voltage or the (N−1)th start pulse signal;
    a buffer unit, electrically connected to the first input unit and the second pull-down unit, for forwarding the driving control voltage having low voltage level to the second pull-down unit;
    a second input unit, electrically connected to the second pull-down unit, for forwarding the (N−1)th start pulse signal to the second pull-down unit according to the second clock;
    a second pull-up unit, electrically connected to the first scan line and the first control unit, for pulling up the first scan signal according to the first control signal;
    a third pull-up unit, electrically connected to the first control unit, for pulling up the driving control voltage and the Nth start pulse signal according to the first control signal; and
    a fourth pull-up unit, electrically connected to the second scan line and the first input unit, for pulling up the second scan signal according to the driving control voltage; and
    an emission signal generation module, electrically connected to a transmission line, for generating an emission signal according to a third clock and a fourth clock having a phase opposite to the third clock, the emission signal being furnished to the transmission line, wherein a pulse width of the emission signal is substantially identical to a pulse width of the third clock.

2. The shift register circuit of claim 1, wherein the scan signal generation module of the Nth shift register stage further comprises:
    a third pull-down unit, electrically connected to the second scan line and the first control unit, for pulling down the second scan signal according to the first control signal.

3. The shift register circuit of claim 2, wherein:
    the first pull-down unit comprises a first transistor, the first transistor comprising:
    a first end for receiving the first clock;
    a gate end for receiving the driving control voltage; and
    a second end for outputting the Nth start pulse signal;
    the first pull-up unit comprises a second transistor, the second transistor comprising:
    a first end electrically connected to the second end of the first transistor;
    a gate end for receiving the (N+1)th start pulse signal; and
    a second end for receiving a high reference voltage;
    the first input unit comprises a third transistor, the third transistor comprising:
    a first end for receiving the (N−1)th start pulse signal;
    a gate end for receiving the second clock; and
    a second end electrically connected to the gate end of the first transistor;
    the buffer unit comprises a fourth transistor, the fourth transistor comprising:

a first end electrically connected to the gate end of the first transistor;
a gate end electrically connected to the first end of the fourth transistor; and
a second end electrically connected to the second pull-down unit;
the second pull-down unit comprises a fifth transistor, the fifth transistor comprising:
a first end for receiving a low reference voltage;
a gate end electrically connected to the second end of the fourth transistor; and
a second end electrically connected to the first scan line;
the second pull-up unit comprises a sixth transistor, the sixth transistor comprising:
a first end electrically connected to the second end of the fifth transistor;
a gate end electrically connected to the first control unit for receiving the first control signal; and
a second end for receiving the high reference voltage;
the second input unit comprises a seventh transistor, the seventh transistor comprising:
a first end for receiving the (N−1)th start pulse signal;
a gate end for receiving the second clock; and
a second end electrically connected to the gate end of the fifth transistor;
the first control unit comprises an eighth transistor and a ninth transistor, wherein:
the eighth transistor comprises:
a first end for receiving the low reference voltage;
a gate end electrically connected to the first end of the eighth transistor; and
a second end electrically connected to the gate end of the sixth transistor; and
the ninth transistor comprises:
a first end electrically connected to the second end of the eighth transistor;
a gate end electrically connected to the gate end of the first transistor; and
a second end for receiving the high reference voltage;
the third pull-up unit comprises a tenth transistor and an eleventh transistor, wherein:
the tenth transistor comprises:
a first end electrically connected to the gate end of the first transistor;
a gate end electrically connected to the second end of the eighth transistor; and
a second end for receiving the high reference voltage; and
the eleventh transistor comprises:
a first end electrically connected to the second end of the first transistor;
a gate end electrically connected to the gate end of the tenth transistor; and
a second end for receiving the high reference voltage;
the third pull-down unit comprises a twelfth transistor, the twelfth transistor comprising:
a first end for receiving the low reference voltage;
a gate end electrically connected to the second end of the eighth transistor; and
a second end electrically connected to the second scan line; and
the fourth pull-up unit comprises a thirteenth transistor, the thirteenth transistor comprising:
a first end electrically connected to the second end of the twelfth transistor;
a gate end electrically connected to the gate end of the first transistor; and
a second end for receiving the high reference voltage.

4. The shift register circuit of claim 3, wherein:
the first input unit further comprises a fourteenth transistor, the fourteenth transistor comprising:
a first end electrically connected to the second end of the third transistor;
a gate end electrically connected to the gate end of the third transistor; and
a second end electrically connected to the gate end of the first transistor; and
the scan signal generation module of the Nth shift register stage further comprises a voltage regulation unit, electrically connected to the first input unit and the first pull-down unit, for stabilizing the driving control voltage according to the Nth start pulse signal, the voltage regulation unit comprising a fifteenth transistor, the fifteenth transistor comprising:
a first end electrically connected to the second end of the first transistor;
a gate end electrically connected to the first end of the fifteenth transistor; and
a second end electrically connected to the first end of the fourteenth transistor.

5. The shift register circuit of claim 1, wherein the scan signal generation module of the Nth shift register stage further comprises:
a second control unit, electrically connected to the first input unit, for generating a second control signal according to the driving control voltage; and
a third pull-down unit, electrically connected to the second scan line and the second control unit, for pulling down the second scan signal according to the second control signal.

6. The shift register circuit of claim 5, wherein:
the first pull-down unit comprises a first transistor, the first transistor comprising:
a first end for receiving the first clock;
a gate end for receiving the driving control voltage; and
a second end for outputting the Nth start pulse signal;
the first pull-up unit comprises a second transistor, the second transistor comprising:
a first end electrically connected to the second end of the first transistor;
a gate end for receiving the (N+1)th start pulse signal; and
a second end for receiving a high reference voltage;
the first input unit comprises a third transistor, the third transistor comprising:
a first end for receiving the (N−1)th start pulse signal;
a gate end for receiving the second clock; and
a second end electrically connected to the gate end of the first transistor;
the buffer unit comprises a fourth transistor, the fourth transistor comprising:
a first end electrically connected to the gate end of the first transistor;
a gate end electrically connected to the first end of the fourth transistor; and
a second end electrically connected to the second pull-down unit;
the second pull-down unit comprises a fifth transistor, the fifth transistor comprising:
a first end for receiving a low reference voltage;
a gate end electrically connected to the second end of the fourth transistor; and
a second end electrically connected to the first scan line;

the second pull-up unit comprises a sixth transistor, the sixth transistor comprising:
  a first end electrically connected to the second end of the fifth transistor;
  a gate end electrically connected to the first control unit for receiving the first control signal; and
  a second end for receiving the high reference voltage;
the second input unit comprises a seventh transistor, the seventh transistor comprising:
  a first end for receiving the (N−1)th start pulse signal;
  a gate end for receiving the second clock; and
  a second end electrically connected to the gate end of the fifth transistor;
the first control unit comprises an eighth transistor and a ninth transistor, wherein:
  the eighth transistor comprises:
    a first end for receiving the low reference voltage;
    a gate end electrically connected to the first end of the eighth transistor; and
    a second end electrically connected to the gate end of the sixth transistor; and
  the ninth transistor comprises:
    a first end electrically connected to the second end of the eighth transistor;
    a gate end electrically connected to the gate end of the first transistor; and
    a second end for receiving the high reference voltage;
the third pull-up unit comprises a tenth transistor and an eleventh transistor, wherein:
  the tenth transistor comprises:
    a first end electrically connected to the gate end of the first transistor;
    a gate end electrically connected to the second end of the eighth transistor; and
    a second end for receiving the high reference voltage; and
  the eleventh transistor comprises:
    a first end electrically connected to the second end of the first transistor;
    a gate end electrically connected to the gate end of the tenth transistor; and
    a second end for receiving the high reference voltage;
the second control unit comprises a twelfth transistor and a thirteenth transistor, wherein:
  the twelfth transistor comprises:
    a first end for receiving the low reference voltage;
    a gate end electrically connected to the first end of the twelfth transistor; and
    a second end electrically connected to the third pull-down unit; and
  the thirteenth transistor comprises:
    a first end electrically connected to the second end of the twelfth transistor;
    a gate end electrically connected to the gate end of the first transistor; and
    a second end for receiving the high reference voltage;
the third pull-down unit comprises a fourteenth transistor, the fourteenth transistor comprising:
  a first end for receiving the low reference voltage;
  a gate end electrically connected to the second end of the twelfth transistor; and
  a second end electrically connected to the second scan line; and
the fourth pull-up unit comprises a fifteenth transistor, the fifteenth transistor comprising:
  a first end electrically connected to the second end of the fourteenth transistor;
  a gate end electrically connected to the gate end of the first transistor; and
  a second end for receiving the high reference voltage.

7. The shift register circuit of claim 6, wherein:
the first input unit further comprises a sixteenth transistor, the sixteenth transistor comprising:
  a first end electrically connected to the second end of the third transistor;
  a gate end electrically connected to the gate end of the third transistor; and
  a second end electrically connected to the gate end of the first transistor; and
the scan signal generation module of the Nth shift register stage further comprises a voltage regulation unit, electrically connected to the first input unit and the first pull-down unit, for stabilizing the driving control voltage according to the Nth start pulse signal, the voltage regulation unit comprising a seventeenth transistor, the seventeenth transistor comprising:
  a first end electrically connected to the second end of the first transistor;
  a gate end electrically connected to the first end of the seventeenth transistor; and
  a second end electrically connected to the first end of the sixteenth transistor.

8. The shift register circuit of claim 1, wherein the third clock is synchronized with the first clock.

9. The shift register circuit of claim 1, wherein the third clock lags the first clock by a phase difference of less than 90 degrees.

10. A shift register circuit comprising a plurality of shift register stages, each of the shift register stages comprising:
  a scan signal generation module, electrically connected to a first scan line and a second scan line, for generating a first scan signal and a second scan signal which have pulses opposite to each other according to a first clock and a second clock having a phase opposite to the first clock, the first and second scan signals being furnished to the first and second scan lines respectively, wherein a pulse width of the first scan signal is substantially twice as wide as a pulse width of the first clock; and
  an emission signal generation module of an Nth shift register stage of the shift register stages, electrically connected to a transmission line, for generating an emission signal according to a third clock and a fourth clock having a phase opposite to the third clock, the emission signal being furnished to the transmission line, wherein a pulse width of the emission signal is substantially identical to a pulse width of the third clock, and the emission signal generation module comprises:
    a first pull-down unit for pulling down an Nth start pulse signal according to a driving control voltage and the third clock;
    a first pull-up unit for pulling up the Nth start pulse signal according to an (N+1)th start pulse signal;
    an input unit, electrically connected to the first pull-down unit, for inputting an (N−1)th start pulse signal to become the driving control voltage according to the fourth clock;
    a control unit, electrically connected to the input unit, for generating a control signal according to the driving control voltage;
    a second pull-up unit, electrically connected to the control unit, for pulling up the driving control voltage and the Nth start pulse signal according to the control signal;

a second pull-down unit, electrically connected to the transmission line, for pulling down the emission signal according to the fourth clock; and a third pull-up unit, electrically connected to the transmission line and the first pull-down unit, for pulling up the emission signal according to the Nth start pulse signal.

11. The shift register circuit of claim 10, wherein:

the first pull-down unit comprises a first transistor, the first transistor comprising:
- a first end for receiving the third clock;
- a gate end for receiving the driving control voltage; and
- a second end for outputting the Nth start pulse signal;

the first pull-up unit comprises a second transistor, the second transistor comprising:
- a first end electrically connected to the second end of the first transistor;
- a gate end for receiving the (N+1)th start pulse signal; and
- a second end for receiving a high reference voltage;

the input unit comprises a third transistor, the third transistor comprising:
- a first end for receiving the (N−1)th start pulse signal;
- a gate end for receiving the fourth clock; and
- a second end electrically connected to the gate end of the first transistor;

the control unit comprises a fourth transistor and a fifth transistor, wherein:

the fourth transistor comprises:
- a first end for receiving a low reference voltage;
- a gate end electrically connected to the first end of the fourth transistor; and
- a second end electrically connected to the second pull-up unit; and the fifth transistor comprises:
- a first end electrically connected to the second end of the fourth transistor;
- a gate end electrically connected to the gate end of the first transistor; and
- a second end for receiving the high reference voltage;

the second pull-up unit comprises a sixth transistor and a seventh transistor, wherein:

the sixth transistor comprises:
- a first end electrically connected to the gate end of the first transistor;
- a gate end electrically connected to the second end of the fourth transistor; and
- a second end for receiving the high reference voltage; and the seventh transistor comprises:
- a first end electrically connected to the second end of the first transistor;
- a gate end electrically connected to the gate end of the sixth transistor; and
- a second end for receiving the high reference voltage;

the second pull-down unit comprises an eighth transistor, the eighth transistor comprising:
- a first end for receiving the low reference voltage;
- a gate end for receiving the fourth clock; and
- a second end electrically connected to the transmission line; and the third pull-up unit comprises a ninth transistor, the ninth transistor comprising:
- a first end electrically connected to the transmission line;
- a gate end electrically connected to the second end of the first transistor; and
- a second end for receiving the high reference voltage.

12. The shift register circuit of claim 11, wherein:

the input unit further comprises a tenth transistor, the tenth transistor comprising:
- a first end electrically connected to the second end of the third transistor;
- a gate end electrically connected to the gate end of the third transistor; and
- a second end electrically connected to the gate end of the first transistor; and the emission signal generation module of the Nth shift register stage further comprises a voltage regulation unit, electrically connected to the input unit and the first pull-down unit, for stabilizing the driving control voltage according to the Nth start pulse signal, the voltage regulation unit comprising an eleventh transistor, the eleventh transistor comprising:
- a first end electrically connected to the second end of the first transistor;
- a gate end electrically connected to the first end of the eleventh transistor; and
- a second end electrically connected to the first end of the tenth transistor.

13. The shift register circuit of claim 11, wherein the second pull-down unit is further employed to pull down the emission signal according to the (N+1)th start pulse signal.

14. The shift register circuit of claim 13, wherein the second pull-down unit further comprises a tenth transistor, the tenth transistor comprising:
- a first end for receiving the low reference voltage;
- a gate end for receiving the (N+1)th start pulse signal; and
- a second end electrically connected to the transmission line.

15. A shift register circuit for providing plural scan signals and plural emission signals, the shift register circuit comprising a plurality of shift register stages, an Nth shift register stage of the shift register stages comprising:

a first pull-down unit for pulling down an Nth scan signal of the scan signals according to a driving control voltage and a first clock;

a first pull-up unit for pulling up the Nth scan signal according to an (N+1)th scan signal;

an input unit, electrically connected to the first pull-down unit, for inputting an (N−1)th scan signal to become the driving control voltage according to a second clock;

a first control unit, electrically connected to the input unit, for generating a first control signal according to the driving control voltage;

a second pull-up unit, electrically connected to the first control unit, for pulling up the driving control voltage and the Nth scan signal according to the first control signal; and an emission signal generation module, electrically connected to the input unit, for generating an Nth emission signal of the emission signals according to the driving control voltage.

16. The shift register circuit of claim 15, wherein:

the first pull-down unit comprises a first transistor, the first transistor comprising:
- a first end for receiving the first clock;
- a gate end for receiving the driving control voltage; and
- a second end for outputting the Nth scan signal;

the first pull-up unit comprises a second transistor, the second transistor comprising:
- a first end electrically connected to the second end of the first transistor;
- a gate end for receiving the (N+1)th scan signal; and
- a second end for receiving a high reference voltage;

the input unit comprises a third transistor, the third transistor comprising:
  a first end for receiving the (N−1)th scan signal;
  a gate end for receiving the second clock; and
  a second end electrically connected to the gate end of the first transistor;
the first control unit comprises a fourth transistor and a fifth transistor, wherein:
  the fourth transistor comprises:
    a first end for receiving a low reference voltage;
    a gate end electrically connected to the first end of the fourth transistor; and
    a second end electrically connected to the second pull-up unit; and
  the fifth transistor comprises:
    a first end electrically connected to the second end of the fourth transistor;
    a gate end electrically connected to the gate end of the first transistor; and
    a second end for receiving the high reference voltage; and
the second pull-up unit comprises a sixth transistor and a seventh transistor, wherein:
  the sixth transistor comprises:
    a first end electrically connected to the gate end of the first transistor;
    a gate end electrically connected to the second end of the fourth transistor; and
    a second end for receiving the high reference voltage; and
  the seventh transistor comprises:
    a first end electrically connected to the second end of the first transistor;
    a gate end electrically connected to the gate end of the sixth transistor; and
    a second end for receiving the high reference voltage.

17. The shift register circuit of claim 16, wherein the emission signal generation module comprises:
  a second pull-down unit for pulling down the Nth emission signal according to the first control signal, the second pull-down unit comprising an eighth transistor, the eighth transistor comprising:
    a first end for receiving the low reference voltage;
    a gate end electrically connected to the second end of the fourth transistor; and
    a second end for outputting the Nth emission signal; and
  a third pull-up unit for pulling up the Nth emission signal according to the driving control voltage, the third pull-up unit comprising a ninth transistor, the ninth transistor comprising:
    a first end electrically connected to the second end of the eighth transistor;
    a gate end electrically connected to the gate end of the first transistor; and
    a second end for receiving the high reference voltage.

18. The shift register circuit of claim 16, wherein the emission signal generation module comprises:
  a second control unit for generating a second control signal according to the driving control voltage, the second control unit comprising an eighth transistor and a ninth transistor, wherein:
    the eighth transistor comprises:
      a first end for receiving the low reference voltage;
      a gate end electrically connected to the first end of the eighth transistor; and
      a second end for outputting the second control signal; and
    the ninth transistor comprises:
      a first end electrically connected to the second end of the eighth transistor;
      a gate end electrically connected to the gate end of the first transistor; and
      a second end for receiving the high reference voltage;
  a second pull-down unit for pulling down the Nth emission signal according to the second control signal, the second pull-down unit comprising a tenth transistor, the tenth transistor comprising:
    a first end for receiving the low reference voltage;
    a gate end electrically connected to the second end of the eighth transistor; and
    a second end for outputting the Nth emission signal; and
  a third pull-up unit for pulling up the Nth emission signal according to the driving control voltage, the third pull-up unit comprising an eleventh transistor, the eleventh transistor comprising:
    a first end electrically connected to the second end of the tenth transistor;
    a gate end electrically connected to the gate end of the first transistor; and
    a second end for receiving the high reference voltage.

19. The shift register circuit of claim 16, wherein:
the input unit further comprises an eighth transistor, the eighth transistor comprising:
  a first end electrically connected to the second end of the third transistor;
  a gate end electrically connected to the gate end of the third transistor; and
  a second end electrically connected to the gate end of the first transistor; and
the Nth shift register stage further comprises a voltage regulation unit, electrically connected to the input unit and the first pull-down unit, for stabilizing the driving control voltage according to the Nth scan signal, the voltage regulation unit comprising a ninth transistor, the ninth transistor comprising:
  a first end electrically connected to the second end of the first transistor;
  a gate end electrically connected to the first end of the ninth transistor; and
  a second end electrically connected to the first end of the eighth transistor.

* * * * *